(12) United States Patent
Lee

(10) Patent No.: US 7,027,044 B2
(45) Date of Patent: Apr. 11, 2006

(54) POWER LINE ARRANGEMENT FOR ELECTROLUMINESCENCE DISPLAY DEVICES

(75) Inventor: Kuo Sheng Lee, Yongkang (TW)

(73) Assignee: AU Optronics Corporation, (TW)

( * ) Notice: Subject to any disclaimer, the term of this patent is extended or adjusted under 35 U.S.C. 154(b) by 47 days.

(21) Appl. No.: 10/783,523

(22) Filed: Feb. 20, 2004

(65) Prior Publication Data

US 2005/0184672 A1    Aug. 25, 2005

(51) Int. Cl.
*G09G 5/00* (2006.01)
*G09G 3/10* (2006.01)

(52) U.S. Cl. .................... 345/211; 315/169.1

(58) Field of Classification Search ........... 315/167, 315/169.1; 345/211, 55; 313/506; 257/40
See application file for complete search history.

(56) References Cited

U.S. PATENT DOCUMENTS

| | | | |
|---|---|---|---|
| 5,949,194 A * | 9/1999 | Kawakami et al. | 315/169.4 |
| 6,307,324 B1 * | 10/2001 | Hirano et al. | 315/169.3 |
| 6,633,135 B1 * | 10/2003 | Nara et al. | 315/169.3 |
| 6,690,028 B1 * | 2/2004 | Wakimoto et al. | 257/40 |
| 6,828,723 B1 * | 12/2004 | Matsumoto et al. | 313/500 |
| 2001/0043168 A1 * | 11/2001 | Koyama et al. | 345/52 |
| 2002/0088984 A1 * | 7/2002 | Toda et al. | 257/99 |
| 2003/0063081 A1 * | 4/2003 | Kimura et al. | 345/211 |
| 2003/0111954 A1 * | 6/2003 | Koo et al. | 313/498 |
| 2003/0128200 A1 * | 7/2003 | Yumoto | 345/211 |
| 2004/0080470 A1 * | 4/2004 | Yamazaki et al. | 345/76 |
| 2004/0178719 A1 * | 9/2004 | Sun | 313/500 |

FOREIGN PATENT DOCUMENTS

JP        2005215354      * 8/2005

* cited by examiner

*Primary Examiner*—Wilson Lee
*Assistant Examiner*—Angela M Lie
(74) *Attorney, Agent, or Firm*—Duane Morris LLP

(57) ABSTRACT

An organic light emission display device with improved power supply line arrangement and method for forming the same is disclosed. The device has a cathode layer, an insulating layer covering at least one portion of the cathode layer, and a power supply plane formed on the insulating layer overlapping the covered portion of the cathode layer to form a predetermined area under which a display area is located, wherein the power supply plane provides even distribution of power to the display area.

22 Claims, 3 Drawing Sheets

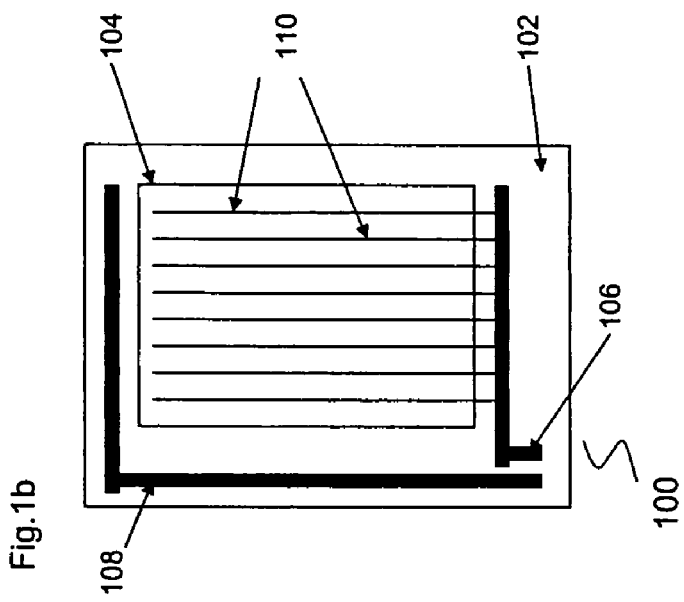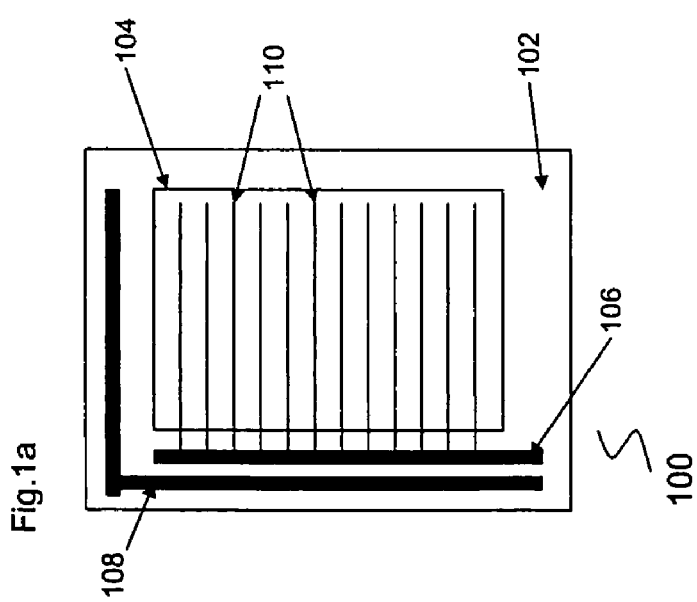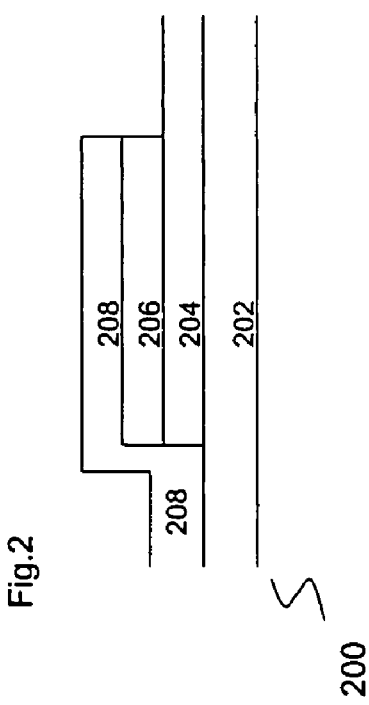

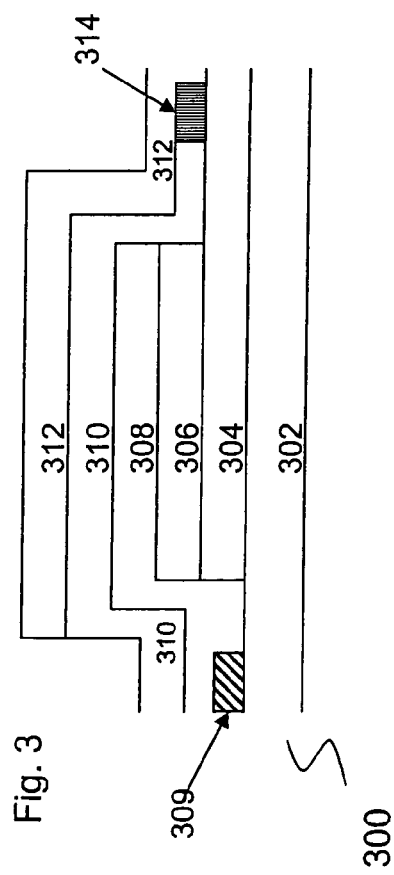
Fig. 3
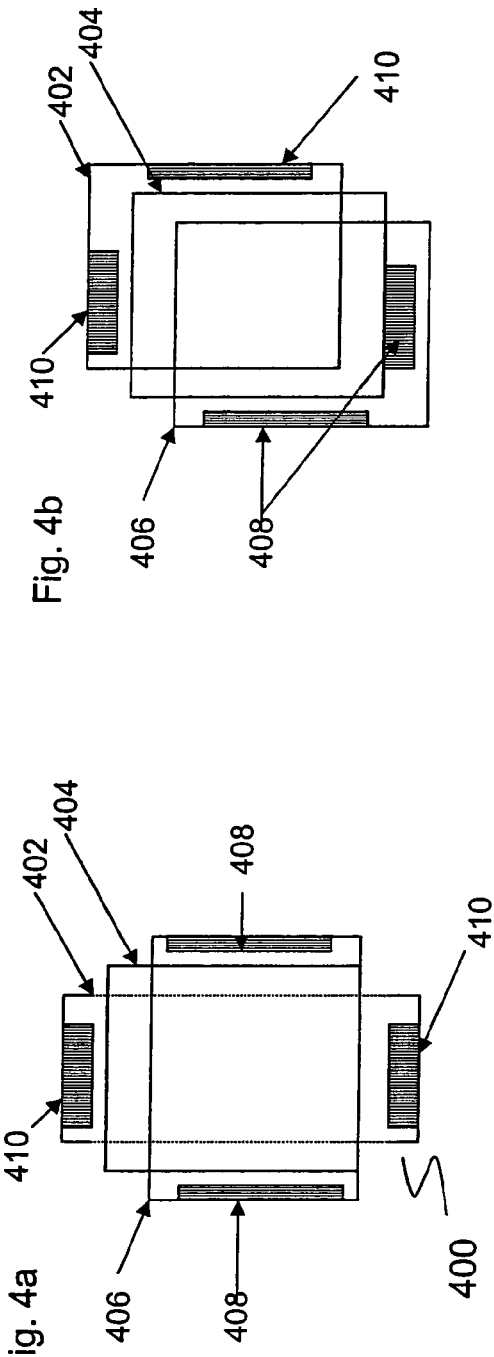
Fig. 4a
Fig. 4b

POWER LINE ARRANGEMENT FOR ELECTROLUMINESCENCE DISPLAY DEVICES

BACKGROUND

The present disclosure relates generally to electroluminescence (EL) display devices, and more particularly to the design of the voltage power lines used for the display elements of the electro-optical display devices and the like.

Typical electroluminescence (EL) display devices comprise of a plurality of light emitting diode (LED) elements (pixels) which are connected and arranged in a matrix, row-column array construction. Using organic light emitting diode (OLED) pixels as an example, each pixel is equipped with a switching and a driving circuit, usually comprised of capacitors and thin film transistors (TFTs) connected to scan, data and voltage power lines. The combination of these circuits and lines serve to provide display information and emission for each OLED pixel. Image display information is sent to the matrix of OLED pixels via routings of the scan and data lines that are connected to drive each OLED pixel-circuit set. Power lines provide the positive (Vdd) and negative (Vss) voltages required to power the emission of the driven EL diodes. Specifically, the Vdd power supply is connected to the driving anodes of the OLED elements and the Vss power supply is connected to the elements' cathodes.

The three line types, scan, data and power, are comprised of conducting metal alloys. Conducting metal alloys featuring low resistivity material property are used as the lines to help maintain low operating resistance minimizing the voltage drop effects due to the material properties of the lines. Resistance may be defined by the following resistance equation for a solid rod or line material, $R=\rho*L/A$. The equation utilizes the resistivity constant $\rho$ for the given material, L the length of the rod or line material, and A the cross-sectional area of the rod or line material. The relationship of resistance to voltage is described by Ohm's Law, $V=R*I$ where the voltage (V) drop across a given material for a passing current (I) is dependant upon the electrical resistance (R) of the conducting material. The construction of the display device's matrix array unfortunately results with metal line routings of different lengths and cross-sectional areas to each OLED pixel-circuit set from the originating scan, data, and or power sources. The varying routing lengths of the metal lines effectively impose varying in-line resistance values onto the various OLED pixel-circuit sets. As result, the delivered voltage level to the OLED pixels and their associated circuits may not be the same for all OLED pixel locations of the EL display device's matrix array.

FIGS. 1a and 1b are top views of two typical OLED display devices illustrating the distribution and routings of the Vdd and Vss power supply lines throughout the OLED display device. These OLED display devices are of the bottom-emitting type, where the OLED emit in the direction originating from the EL material layer, through the OLED display elements' Vdd anode material and the device substrate.

FIG. 1a shows the OLED display device 100 comprising of a device substrate 102 and an active OLED pixel display area 104. The two major power bus lines for supplying power to the OLED EL elements are shown as the Vdd bus line 106 and the Vss bus line 108, located adjacent to the active OLED pixel area 104. As viewed by FIGS. 1a and 1b, the Vss bus line 108 connections to the EL display elements of the active OLED pixel area 104 are accomplished with line routings (not shown) from the Vss bus line 108, underneath the active OLED pixel display area 104, to the OLED EL display elements. Connections from the Vdd bus line 106 to the OLED display elements of the active OLED pixel display area 104 are routed through the smaller Vdd lines 110 of FIGS. 1a and 1b. Note that the routing across the active OLED pixel area 104 for FIG. 1a is in a row alignment/arrangement, while the Vdd lines 110 of FIG. 1B is shown in a column alignment/arrangement. Each Vdd line 110 layout provides a path from their main Vdd bus line 106 to the individual OLED pixel display elements of the active OLED pixel area 104. It is also noted that the lengths of the Vdd and Vss power supply lines to each EL element location within the active OLED pixel area 104 are not equal. In other words, the total metal volume used for delivering power to each EL element location through the various metal buses and lines are not equal. This inequality of conductance paths leads to varying resistances applied to the power line routings such that varying voltages are delivered to the individual EL display elements. Further, due to the voltage drop along the line, the pixels of the display device at the far end of the supply lines 110 away from the power supply bus line 106 suffers from a relatively lower power supply level, thereby degrading the display quality.

FIG. 2 illustrates a basic cross-sectional view of an OLED device 200 within the active OLED pixel area. The device substrate 202 is shown at the bottom, with the OLED anode 204 located on the device substrate. The OLED emissive EL element 206 is shown attached to the anode 204. The cathode 208 is also attached to the OLED emissive EL element 206 on the side opposite than that of the attached anode 204. It is noted that there are other dielectric material layers and structures that may be present and located between adjacent anode 204 and cathode 208, and between certain areas of the OLED EL emissive element 206 and the adjacent metal layers, for the purpose of insulating the conducting lines and certain circuit component features from each other. These dielectric layers and structures are not shown on the FIGS. 1a, 1b and 2, to help simplify and emphasize the inventions disclosed.

Referring back to FIGS. 1a and 1b, the metal power supply bus lines, Vss lines 108 and Vdd lines 106 and 110 feature routing layouts that are two-dimensional, with no like lines in any vertically overlapping or multi-layered arrangement. The cross-sectional view of FIG. 2 also shows the non-overlapping arrangement. The cathode 208 is shown to have at least one vertical step, from one height to another within it's routing, but it is noted that the routing with the vertical step does not feature any overlap or multi-layering arrangement of the metal line.

Advanced EL display devices feature high performance image display qualities taking into consideration of factors such as brightness, contrast, resolution, colors, flicker, distortion and linearity. In addition, advanced EL display devices may feature high operational refresh speeds, as well as low overall power consumption. Varying and unbalanced levels of voltage between the OLED pixel locations of such advanced EL display devices may counteract and cause undesired effects upon the image display qualities, as well as to the operational speeds and power consumption. While efforts have been made to utilize metal lines featuring low resistivity material, more focus is needed upon the other contributing factors (e.g., length L and cross-sectional area A) to lower the resistance (R) of the metal lines.

What is desirable is an improved method for the design and routing of power supply lines that features lower resistance throughout the different routings and lengths to the individual OLED pixel emission locations since lower resistance metal lines would provide lower magnitudes of voltage drops to the OLED pixel emission elements.

SUMMARY

In view of the foregoing, this disclosure provides an improved method for delivering power to display devices for avoiding degraded display quality due to the voltage drop across the power supply lines.

In one example, a light emission display device with improved power supply line arrangement and method for forming the same is disclosed. The device has a cathode layer, an insulating layer covering at least one portion of the cathode layer, and a power supply plane formed on the insulating layer overlapping the covered portion of the cathode layer to form a predetermined area under which a display area is located, wherein the power supply plane provides even distribution of power to the active display area.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a and 1b illustrate top views of two typical OLED display devices illustrating the distribution and routings of the Vdd and Vss supply lines within the OLED display device.

FIG. 2 illustrates a basic cross-sectional view of the OLED display pixel area.

FIG. 3 illustrates a cross-sectional view of the OLED Vdd line and the Vss line routings within the active OLED pixel areas of an OLED display device in accordance with one example of the present disclosure.

FIGS. 4a and 4b illustrate top views of several material layers of a display device in accordance with two examples of the present disclosure.

DESCRIPTION

Figure 5A:
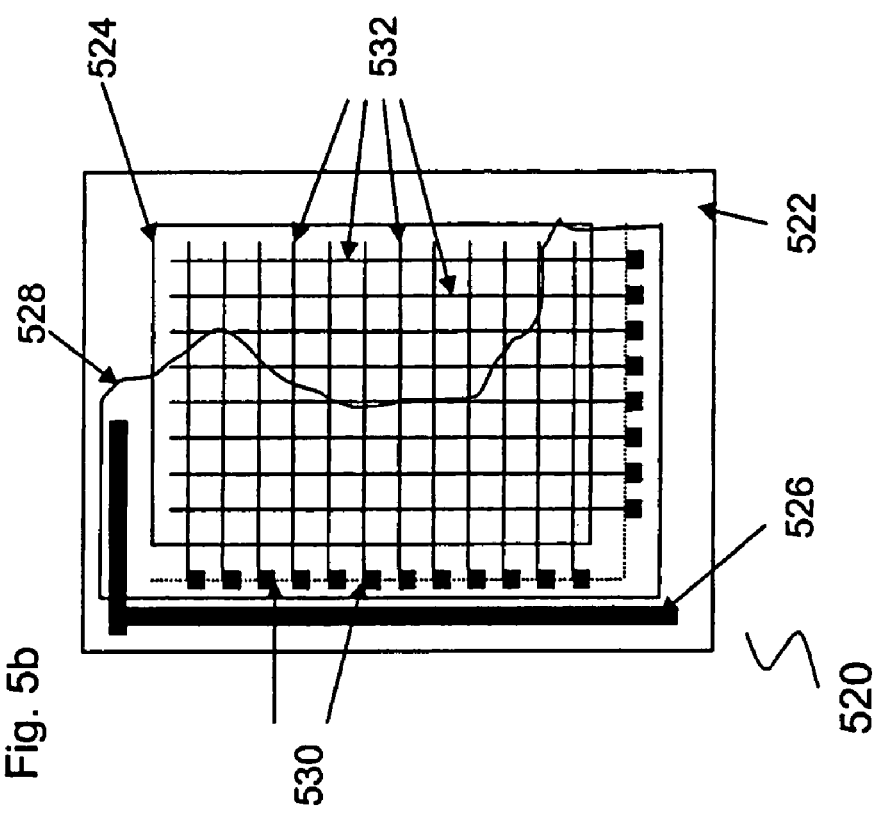
FIGS. 5a and 5b are top views of two OLED display devices illustrating two examples of the distribution and routings of the Vdd and Vss supply lines in accordance with the present disclosure.

The present disclosure describes an improved method for arranging power supply lines in order to reduce the voltage drop across the power supply lines used within EL display devices. The disclosed method features an improved metal line routing layout to provide power nearer and closer to the EL display emissive elements such that the voltage drops experienced by the display elements are lowered and minimized. The utilization of a power supply plane to improve the delivery of power requires no or minimal change to the effective width and pitch of the device circuit lines, thus requiring no or little change to the two-dimensional, x-y layout of the associated circuits as well as to the overall size of the of EL display devices.

FIG. 3 illustrates a cross-sectional view of the OLED Vdd line and the Vss line routings within the active OLED pixel areas of an OLED display device with the power lines arranged in a layout in accordance with the present disclosure. The OLED display pixel shown by FIG. 3 is of the bottom-emitting type, as the OLED emission occurs in the direction originating from the EL material layer, through the OLED display element's Vdd anode material and the device substrate. The device substrate 302 is shown with an OLED anode 304 located on the device substrate. The EL element 306 is shown located attached to the anode 304. A cathode material 308 is connected to negative power supply or Vss through interconnections 309. The anode 304 in FIG. 3 may also be referred to the Vdd power line for this display pixel.

The disclosed method provides an additional dielectric layer 310 located on top of the cathode 308. This dielectric layer 310 serves to insulate the cathode 308 from another layer of Vdd power supply material or power supply plane 312, located on top of the dielectric layer. This layer of power supply plane 312 is electrically and physically connected to the anode 304 by power supply lines (or sometimes interconnections) 314 in a location near and adjacent to the OLED pixel's emissive EL element 306. In stead of relying on long metal power supply lines alone, the Vdd power supply plane 312 provides metal volume for conducting power voltage to the active OLED pixel areas, thus lowering the resistance and voltage drop experienced at each emissive EL element 306. The Vdd power supply plane 312 may be comprised of the same or similar metal alloy as that of the anode 304. In this example, the negative power supply or Vss line 309 and the positive power supply or Vdd line 304 are located in locations close to the EL element 306, but on two sides of it.

It is also noted that there may be other elements of display device such as other materials for insulating one conducting line from another. These elements are not shown here in order to simplify and emphasize the locations of the multi-layered power supply arrangement, dielectric layer 310, and the via interconnection 314, with respect to the device substrate 302 and to the EL element 306.

FIG. 4a illustrates a top view of some material layers of the display device 400 in accordance with an example of the present disclosure. For illustration purposes, only the Vss power supply plane or cathode layer 402, the insulating dielectric layer 404 and the Vdd power supply plane 406 are shown, and other layers are ignored. The cathode layer 402 is formed first by using a predetermined mask in a photolithography process to define the boundaries thereof. Next, the insulating dielectric layer 404 is formed over the cathode layer 402, and then, the Vdd power supply plane 406 is provided over the insulating dielectric layer 404. Via interconnections 408 are shown to be constructed to connect the Vdd power supply plane with the anode of each pixel or power supply lines beneath. The cathode layer 402 can make connections to the Vss power bus line through interconnections 410.

FIG. 4b illustrates a top view of some material layers of the display device 400 in accordance with another example of the present disclosure. Similar to FIG. 4a, for illustration purposes, only the cathode layer 402, the insulating dielectric layer 404 and the Vdd power supply plane 406 are shown, and other layers are ignored. In this example, the three different layers of materials are formed with similar sizes. As such, a single photomask can be used for defining the boundaries of these layers in photolithography processes. For example, the cathode layer 402 is formed first by using a predetermined mask to define the boundaries thereof. Next, the insulating dielectric layer 404 is formed over the cathode layer 402 by shifting the same photomask toward left for a predetermined distance, and then, the Vdd power supply plane 406 is provided over the dielectric layer 404 with the photomask shifting toward left for another predetermined distance. These distances are determined based on the overlapping area in the middle that is needed for the EL element and/or spaces available for constructing via interconnections. As shown, interconnections 408 can be constructed to connect the Vdd power supply plane with the power supply lines underneath. The cathode layer 402 can make connections to the Vss power bus line of the active OLED device through interconnections 410.

Figure 5B:
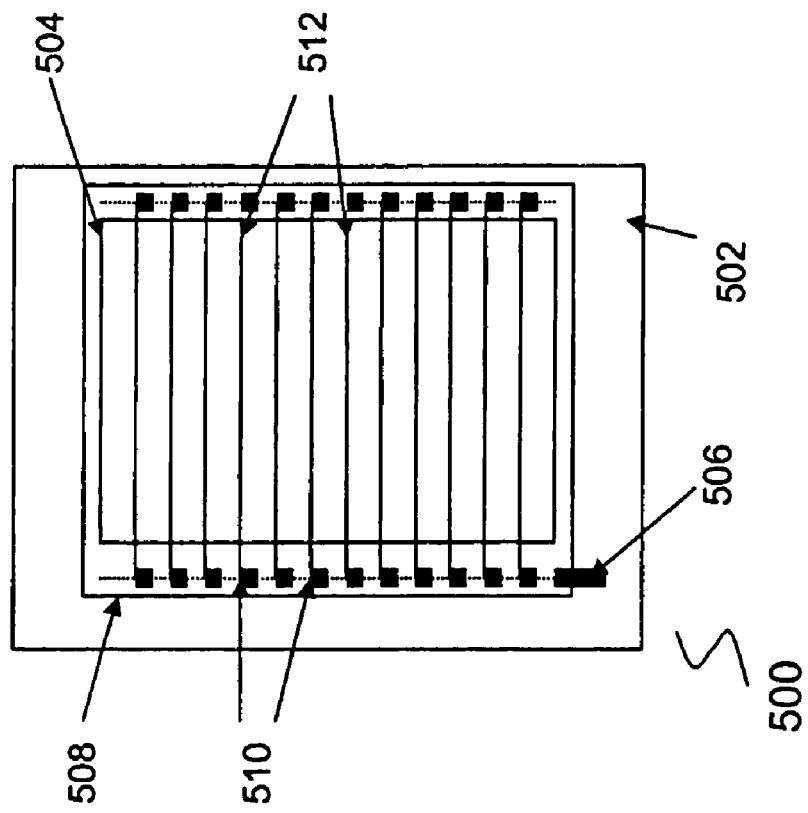

Referring now to FIGS. 5*a* and 5*b*, there are top views of two OLED display devices illustrating two examples of the distribution and routings of the Vdd and supply lines in accordance with the present disclosure. The OLED display device 500 is shown comprising of a device substrate 502 and an active OLED pixel display area 504. A Vdd power bus line 506 supplies power to the OLED device is also shown. The Vss power bus line is intentionally not shown in this illustration as the arrangement for these two power supply lines can be the similar. The Vdd power bus line 506 is connected to the Vdd power supply plane 508, which forms various connections 510 to Vdd power lines 512 that supply the EL display elements with voltage. Since the Vdd power supply plane is a relative large area that covers at least a great portion of the display area, the connections 510 can be made on opposite sides of the display area so that there will be no uneven voltage distribution from one side to the other.

FIG. 5*b* illustrate another example of the present disclosure. The OLED display device 520 is shown comprising of a device substrate 522 and an active OLED pixel display area 524. A power bus line for supplying power to the OLED EL elements are shown as the bus line 526. The bus line 526 is connected to the power supply plane 528, which forms various interconnections 530 to power lines 532 that supply the EL display elements with voltage. Since the power supply plane is large enough to cover at least a major portion of the display area, the interconnections 530 can be made on adjacent sides of the display area to form a power supply line mesh so that uneven voltage distribution will be avoided or reduced. It is further noticed that the power supply plane 528 does not have to be in any particular shape as long as it covers the area in which the interconnections are made. Although not shown, it is understood that there are other via interconnections for electrically and physically connecting the power supply lines 532 to each active EL pixel location.

The present disclosure provides an improved method for the reduction of the voltage drop effects experienced by the metal lines used within EL display devices. The disclosed method utilizing one or more power supply plane for delivering the power voltage to the EL display elements such that the voltage drops experienced by the display elements are lowered and minimized.

The disclosed power supply line arrangement and structures may be applicable for use upon the various metal line levels of the EL display device, including the scan, data, power and any other metal lines as well as for EL display elements of varying styles, including bottom-emitting and top emitting types.

The disclosed power supply line arrangement requires no or minimum change to the practical width and pitches of the set metal lines, thus adding no significant requirement for change to the two-dimensional, x-y layout of the associated circuits, as well as to the overall sizing of the EL display devices. The arrangements of the present disclosure may also be implemented into future as well as older display device technologies, not limited to organic and EL display devices. The benefits provide will allow for display devices of higher reliability, longer operational life and of better performance quality. Such improvements will translate into significant cost improvements for a given production facility to maintain highly competitive cost and output advantages over other manufacturers of similar product devices.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a design and method for, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A display device comprising:
   a display area on a substrate;
   at least one power bus line of a first type;
   at least one power bus line of a second type;
   a cathode layer coupled to display elements in the display area and to the power bus line of the first type through a first interconnect;
   an insulating layer formed on the cathode; and
   a power supply plane formed on the insulating layer connected to the power bus line of the second type through a second interconnect,
   wherein the insulating layer separates the power supply plane from the cathode, and wherein the power supply plane provides an even distribution of power to the EL elements.

2. The device of claim 1 wherein the power bus line of the first type is a negative voltage supply.

3. The device of claim 1 wherein the power bus line of the second type is a positive voltage supply.

4. The device of claim 1 further comprising one or more power supply lines coupled to the power supply plane for providing power to the display elements.

5. The device of claim 4 wherein at least one of the first or the second interconnect is made at different sides of the display area for connecting the power supply plane to the power supply lines.

6. The device of claim 5 wherein the first and the second interconnects are made at opposite sides of the display area.

7. The device of claim 5 wherein the first and the second interconnects are made at adjacent sides of the display area.

8. The device of claim 1 wherein the power supply plane connects to an anode of each display element through a via connection.

9. An organic light emission display device comprising:
   a cathode layer;
   an insulating layer covering at least one portion of the cathode layer; and
   a power supply plane formed on the insulating layer overlapping the covered portion of the cathode layer to form a predetermined area under which a display area is formed,
   wherein the power supply plane provides even distribution of power to the display area through one or more via interconnects which electrically couple the power supply plane to the display area.

10. The device of claim 9 wherein the power supply plane connects to one or more power supply lines through the one or more via interconnections.

11. The device of claim 10 wherein the via interconnections are made at two ends of the power supply lines.

12. The device of claim 10 wherein the power supply lines are in a mesh form.

13. The device of claim 10 wherein the via interconnections are formed in areas of the power supply plane that do not overlap with the insulating layer.

14. The device of claim 9 further comprising a negative voltage supply coupled to the cathode layer.

15. A method for forming power supply of a light emission display device, the method comprising:
   forming a cathode layer;
   forming an insulating layer covering at least one portion of the cathode layer; and
   forming a power supply plane on the insulating layer overlapping the covered portion of the cathode layer to form a predetermined area under which a display area is located,
   forming one or more interconnections for connecting the power supply plane to one or more power supply lines that provide positive voltage to one or more display element in the display area; and
   wherein the power supply plane provides a substantially even distribution of power to the active display area through at least one or more via interconnections.

16. The method of claim 15 wherein the interconnections are formed at two ends of each power supply line.

17. The method of claim 15 wherein the power supply lines are in a mesh form.

18. The method of claim 15 wherein the interconnections are formed in areas of the power supply plane that do not overlap with the insulating layer.

19. The method of claim 15 further comprising forming one or more interconnections for connecting the cathode layer to at least one power bus line in an area that do not overlap with the insulating layer.

20. A display device comprising a display area on a substrate; at least one power bus line of a first type; at least one power bus line of a second type; a cathode layer coupled to display elements in the display area and the power bus line of the first type; an insulating layer formed on the cathode; and a power supply plane formed on the insulating layer connected to the power bus line of the second type, wherein the insulating layer separates the power supply plane from the cathode, and wherein the power supply plane provide even distribution of power to the EL elements; and wherein the power supply plane connects to an anode of each display element through a via connection.

21. An organic light emission display device comprising a cathode layer; an insulating layer covering at least one portion of the cathode layer; and a power supply plane formed on the insulating layer overlapping the covered portion of the cathode layer to form a predetermined area under which a display area is formed, wherein the power supply plane provides even distribution of power to the display area, and wherein the power supply plane connects to one or more power supply lines through one or more interconnections where the interconnections are made at two ends of the power supply lines.

22. A method for forming power supply of a light emission display device, the method comprising:
   forming a cathode layer;
   forming an insulating layer covering at least one portion of the cathode layer;
   forming a power supply plane on the insulating layer overlapping the covered portion of the cathode layer to form a predetermined area under which a display area is located, and
   forming one or more interconnections for connecting the power supply plane to one or more power supply lines that provide positive voltage to one or more display element in the display area, wherein the interconnections are formed at two ends of each power supply line;
   wherein the power supply plane provides even distribution of power to the active display area.

* * * * *